(12) United States Patent
Tachibana et al.

(10) Patent No.: US 6,842,063 B2
(45) Date of Patent: Jan. 11, 2005

(54) ANALOG SWITCH CIRCUIT

(75) Inventors: Suguru Tachibana, Kawasaki (JP); Tatsuo Kato, Kawasaki (JP); Hideo Nunokawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/625,738

(22) Filed: Jul. 24, 2003

(65) Prior Publication Data

US 2004/0119522 A1 Jun. 24, 2004

(30) Foreign Application Priority Data

Aug. 6, 2002 (JP) ........................................ 2002-229123

(51) Int. Cl.$^7$ .............................................. H03K 17/62
(52) U.S. Cl. ........................ 327/404; 327/427; 327/589
(58) Field of Search ................................ 327/403–405, 327/407, 408, 411, 379, 391, 91, 93, 427, 581, 390, 589, 77; 326/113

(56) References Cited

U.S. PATENT DOCUMENTS 5,157,291 A * 10/1992 Shimoda ..................... 327/408
5,880,621 A * 3/1999 Ohashi ........................ 326/113
6,060,914 A * 5/2000 Nunokawa ................... 327/91

FOREIGN PATENT DOCUMENTS

| JP | 06-053799 | 2/1994 |
| JP | 06-140898 | 5/1994 |
| JP | 07-074638 | 3/1995 |
| JP | 07-221642 | 8/1995 |
| JP | 11-220393 | 8/1999 |

* cited by examiner

*Primary Examiner*—Long Nguyen
(74) *Attorney, Agent, or Firm*—Arent Fox PLLC (57) ABSTRACT

An analog switch circuit with superior breakdown voltage characteristics that can operate at a high speed at a low power supply voltage. The analog switch circuit includes a comparator circuit for inputting and comparing an analog input signal input to an analog switch section and a reference signal. If the input potential of the analog input signal is lower than the reference potential of the reference signal, a voltage boost circuit sets a potential of a gate of an n MOS transistor included in the analog switch section to a potential of positive power supply voltage. If the input potential of the analog input signal is higher than the reference potential of the reference signal, the voltage boost circuit boosts the potential of the gate to a potential higher than the potential of power supply voltage.

8 Claims, 4 Drawing Sheets

ANALOG SWITCH CIRCUIT

CROSS-REFERENCE TO RELATED APPLICATIONS

This application is based upon and claims the benefits of priority from the prior Japanese Patent Application No. 2002-229123, filed on Aug. 6, 2002, the entire contents of which are incorporated herein by reference.

BACKGROUND OF THE INVENTION (1) Field of the Invention

This invention relates to an analog switch circuit for sampling an analog signal and, more particularly, to an analog switch circuit having a voltage boost circuit for boosting the potential of a gate of a MOS field effect-transistor included in an analog switch.

(2) Description of the Related Art

Sample and hold circuits are important elements in analog-to-digital (A/D) converters which can be fabricated at a comparatively low cost by a complementary metal-oxide semiconductor (CMOS) process. With CMOS large scale integrated circuits (LSIs), usually an analog switch (or a transfer gate) is used for sampling an analog signal.

With the progress of microfabrication technologies and the spread of battery-operated equipment, it is greatly hoped that not only circuits but also analog switches (transfer gates) will operate at low voltage.

Unlike digital circuits, however, the potential of the source and drain electrodes of metal oxide semiconductor (MOS) field effect transistors included in analog switches etc. used for sampling can be about half (VDD/2) of power supply voltage (VDD) Therefore, voltage between a gate and a source is small compared with digital circuits and it is difficult for analog switches to operate at low voltage.

In these circumstances, some improvements have been suggested to make analog switches operate at low voltage.

For example, Japanese Unexamined Patent Publication No. 7-74638, Japanese Unexamined Patent Publication No. 7-221642, Japanese Unexamined Patent Publication No. 6-53799, or Japanese Unexamined Patent Publication No. 11-220393 discloses a circuit which enables an analog switch to operate at a low voltage by making signal potential at the gate electrode (boosting signal potential at the gate electrode to voltage) higher than power supply potential (in the case of an n-channel MOS field effect transistor) and by making voltage between the gate and source of the n-channel MOS field effect transistor (NMOS transistor) large.

With these circuits, the voltage of the gate of an NMOS transistor can be made higher than power supply voltage applied from the outside even if the power supply voltage is low. As a result, voltage between the gate and source of the NMOS transistor can be made large and the ON-state resistance of the NMOS transistor included in an analog switch can be reduced. Therefore, adding a comparatively simple circuit has enabled a circuit to operate at a high speed at a low voltage.

With the above conventional circuits, however, voltage between the gate and source of an NMOS transistor included in an analog switch may exceed the breakdown voltage, depending on circuit constants and operating conditions. That is to say, the improvement of the low-voltage characteristics of a circuit is restricted by the breakdown voltage of an NMOS transistor.

A circuit which Japanese Unexamined Patent Publication No. 6-140898 discloses is known as a device far reconciling the improvement of the low-voltage characteristics of an analog switch and restriction resulting from the breakdown voltage of an NMOS transistor.

Figure 4:
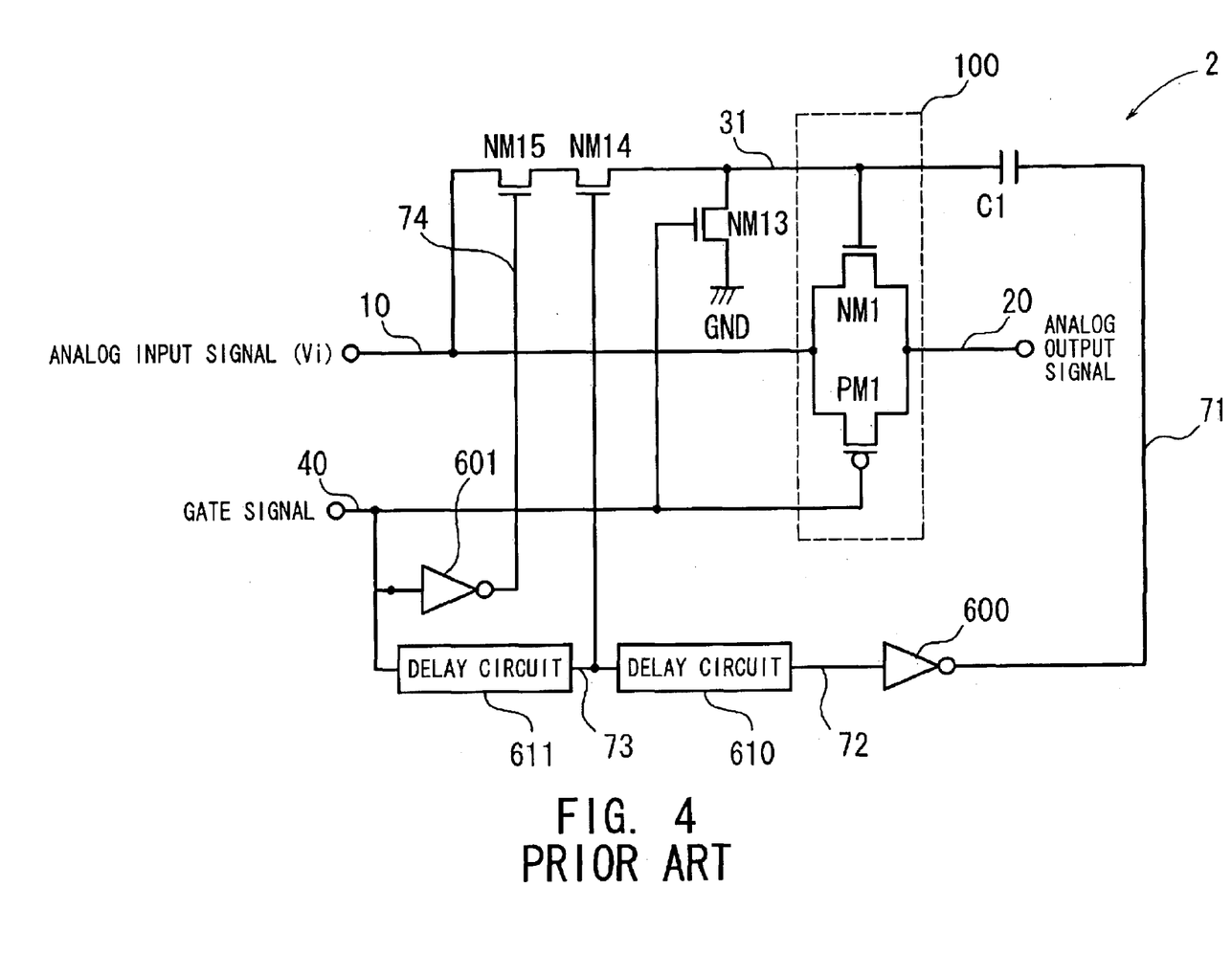
FIG. 4 is a circuit diagram of a conventional analog switch circuit.

FIG. 4 is a circuit diagram of a conventional analog switch circuit.

FIG. 4 is obtained by slightly simplifying the circuit Japanese Unexamined Patent Publication No. 6-140898 discloses.

In an analog switch circuit 2, an NMOS transistor NM1 and a PMOS transistor PM1 make up an analog switch section 100. Sources of the NMOS transistor NMI and the PMOS transistor PM1 are connected to a signal line 10 where an analog input signal (its potential is Vi) is input. Their drains are connected to an output signal line 20. A gate of the PMOS transistor PM1 is connected to a signal line 40 for inputting a gate signal. A gate of the NMOS transistor NM1 is connected to a capacitive element C1 and a drain of an NMOS transistor NM13. One side of the capacitive element C1 is connected to the output side of an inverter 600 via a signal line 71. The input side of the inverter 600 is connected to a delay circuit 610 via a signal line 72. The delay circuit 610 is connected to a delay circuit 611 via a signal line 73. A gate signal is input to the delay circuit 611. A source of an NMOS transistor NM14 is connected to the drain of the NMOS transistor NM13. A source of the NMOS transistor NM13 is connected to ground (GND). A gate of the NMOS transistor NM13 is connected to the signal line 40 where a gate signal is input. A drain of the NMOS transistor NM14 is connected to a source of an NMOS transistor NM15. The source of the NMOS transistor NM14 is connected to the drain of the NMOS transistor NM13 and the gate of the NMOS transistor NM1. A gate of the NMOS transistor NM14 is connected to the signal line 73. A drain of an NMOS transistor NM15 is connected to the signal line 10 where an analog input signal is input. The source of the NMOS transistor NM15 is connected to the drain of the NMOS transistor NM14. A gate of the NMOS transistor NM15 is connected to a signal line 74 which connects with the signal line 40, to which a gate signal is input, via an inverter 601.

Now, operation in the conventional analog switch circuit 2 will be described.

In the analog switch circuit 2, when the potential of the signal line 40 changes from the high level (H level) to the low level (L level) due to a gate signal input, the potential of the signal line 74 connected to the gate of the NMOS transistor NM15 changes from the L level to the H level and the NMOS transistor NM15 turns on. A change in the potential of the signal line 73 connected to the gate of the NMOS transistor NM14 will be delayed by the delay circuit 611. As a result, the signal line 73 keeps the H level at the time when the signal line 74 connected to the gate of the NMOS transistor NM15 changes to the H level. Therefore, the NMOS transistors NM14 and NM15 are in the ON state at the same time and the potential of a signal line 31 is charged to the input potential Vi of an analog input signal (at this time the potential of the signal line 40 is at the L level, so the NMOS transistor NM13 is in the OFF state).

After the potential of the signal line 31 is charged to the input potential Vi, the potential of the signal line 73 connected to the gate of the NMOS transistor NM14 changes to the L level. This change in the potential of the signal line 73 will be delayed by the delay circuit 611. The NMOS transistor NM14 turns off. Then the potential of the signal line 71 changes from the L level to the H level. This change will be delayed by the delay circuit 610 and inverter 600.

The amplitude of a signal on the signal line 71 equals power supply voltage VDD. When the potential of the signal line 71 changes from the L level to the H level, the NMOS transistor NM13 is in the OFF state. The potential of the signal line 31 therefore is boosted from Vi by VDD to (Vi+VDD).

As described above, the potential at the beginning of a voltage boost of the gate of the NMOS transistor NM1 included in the analog switch section 100 in the analog switch circuit 2 is set to Vi, being the potential of input to the analog switch. The potential of the gate of the analog switch is boosted by the capacitive element C1 to about (Vi+VDD). The potential of the source (or drain) of the NMOS transistor NM1 is input potential Vi, so voltage between the gate and source of the NMOS transistor NM1 included in the analog switch is about VDD. That is to say, voltage between the gate and source of the NMOS transistor NM1 will not exceed power supply voltage.

This prevents voltage between the gate and source of the NMOS transistor NM1 from exceeding the breakdown voltage. As a result, the improvement of low-voltage characteristics by a voltage boost and the observance of a restriction on breakdown voltage regardless of circuit constants or operating conditions have been reconciled.

With the conventional analog switch circuit 2, however, the PMOS transistor PM1 is put into the ON state by changing the potential of the gate of the PMOS transistor PM1 from the H level to the L level, the potential of the signal line 31 is charged to Vi, and then the potential of the signal line 31 is boosted to (Vi+VDD). As a result, the time when the NMOS transistor NM1 turns on will be delayed by time taken to charge the signal line 31 to Vi.

As described above, in the analog switch circuit 2, the potential of the signal line 31 rises from Vi by VDD to (Vi+VDD) when the potential of the signal line 71 changes from the L level to the H level. However, only if the capacitance of the capacitive element C1 is sufficiently greater than the parasitic capacitance of the signal line 31, the potential of the signal line 31 will rise by nearly VDD. It is assumed that the capacitance of the gate of the NMOS transistor NM1 is 0.2 pF, that the capacitance of the capacitive element C1 is 1.8 pF (nine times the capacitance of the gate of the NMOS transistor NM1), and that junction capacitance in the NMOS transistors NM13 and NM14 is negligible. If the amplitude of a signal on the signal line 71 is 3 V (VDD), then the potential of the signal line 31 will rise by 2.7 V ((9/10)×VDD). In the analog switch circuit 2, the capacitive element C1 the capacitance of which is sufficiently greater than that of the gate of the NMOS transistor NM1 must be charged to Vi by the NMOS transistors NM14 and NM15. Therefore, if the width (W) of the gates of the NMOS transistors NM14 and NM15 is small, it will take much time to charge the signal line 31 to Vi.

The second factor is the capacitance of a load on the signal line 20, being output from the analog switch section 100. If the capacitance of a load on output from the analog switch is great, usually the size of the NMOS transistor NM1 and PMOS transistor PM1 is designed to become large. It is assumed that the ratio of the capacitance of the gate of the NMOS transistor NM1 to the capacitance of a load on output from the analog switch is about one to ten. If the numeric value used in the above consideration is applied, the capacitance of a load on output from the analog switch is 2.0 pF (because the capacitance of the gate of the NMOS transistor NM1 is 0.2 pF). If the width of the gates of the NMOS transistors NM14 and NM15 in the analog switch circuit 2 is small, it will take much time to charge the signal line 31 to Vi. If the width of the gates of the NMOS transistors NM14 and NM15 is designed to become sufficiently large, input capacitance will be at least the sum of 2.0 pF, being the capacitance of a load on output from the analog switch, and 1.8 pF, being the capacitance of the capacitive element C1. That is to say, at a minimum, input capacitance will roughly double, resulting in longer delay time.

As described above, with the conventional analog switch circuit 2, the original purpose is to operate at a high speed at a low power supply voltage, but there are many factors in an increase in delay time.

SUMMARY OF THE INVENTION

The present invention was made under the background circumstances as described above. An object of the present invention is to provide an analog switch circuit, which has superior breakdown voltage characteristics and which can operate at a high speed at a low power supply voltage.

In order to achieve the above object, an analog switch circuit for sampling an analog signal is provided. This analog switch circuit comprises an analog switch section including a first n-channel MOS field effect transistor and a first p-channel MOS field effect transistor, sources of which are connected, drains of which are connected, and therefore which are connected in parallel, for inputting an analog input signal and for outputting a sampled analog output signal, a comparator circuit for inputting the analog input signal and a reference signal and for comparing the input potential of the analog input signal and the reference potential of the reference signal, and a voltage boost circuit for setting a potential of a gate of the first n-channel MOS field effect transistor to a potential of positive power supply voltage in the case of the input potential being lower than the reference potential at the time of the analog switch section being in a continuity state and for boosting the potential of the gate to a potential higher than the potential of the positive power supply voltage in the case of the input potential being higher than the reference potential at the time of the analog switch section being in a continuity state.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

An embodiment of the present invention will now be described with reference to the drawings.

Figure 1:
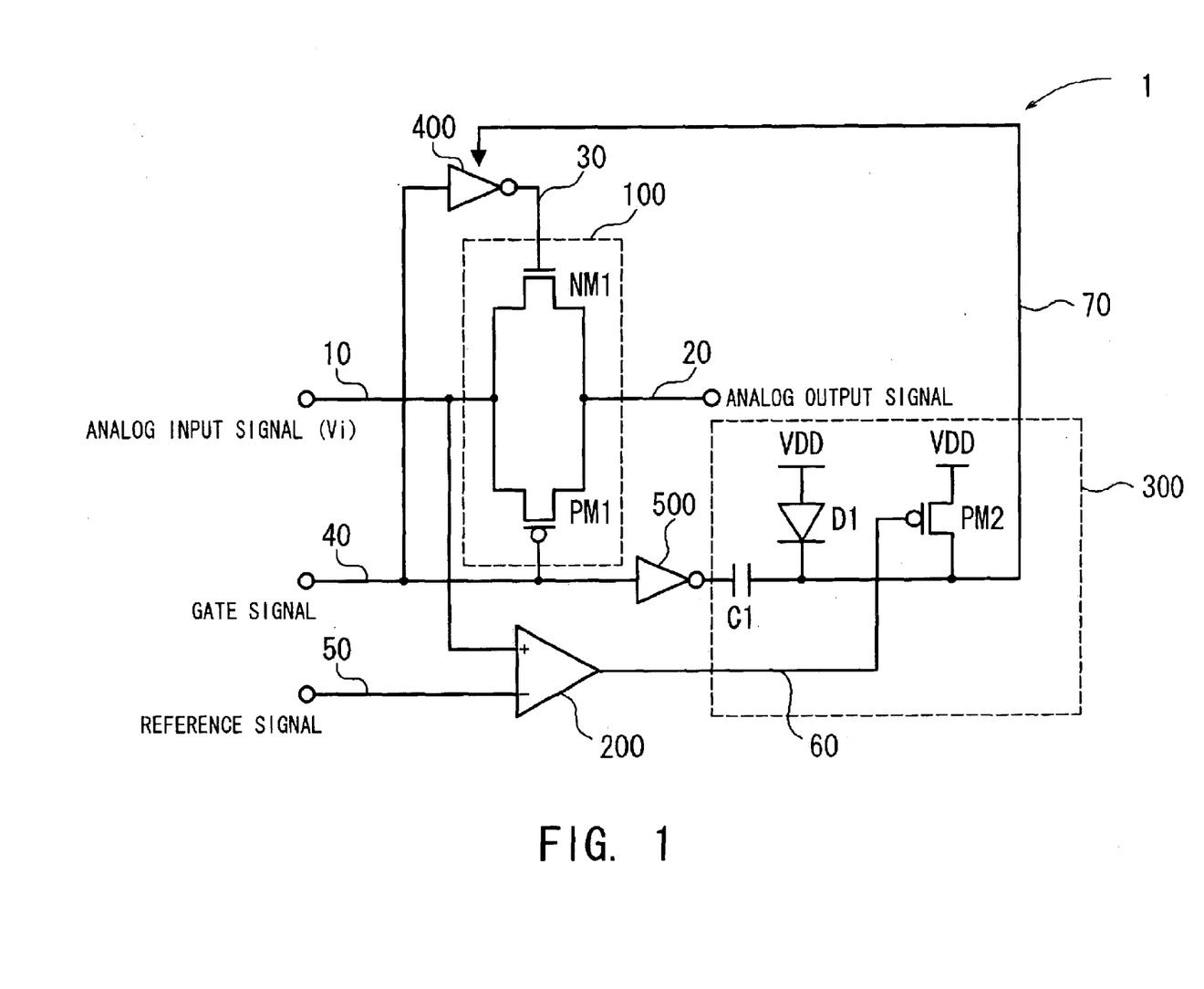
FIG. 1 is a rough circuit diagram of an analog switch circuit according to an embodiment of the present invention.

FIG. 1 is a rough circuit diagram of an analog switch circuit according to an embodiment of the present invention.

An analog switch circuit 1 comprises an analog switch section 100 for turning on and off the switch according to a gate signal input and sampling and outputting an analog input signal input, a comparator circuit 200 for comparing the input potential Vi of an analog input signal and the reference potential of a reference signal, a voltage boost circuit 300 for boosting the potential of a gate of an NMOS transistor NM1, a level conversion circuit 400, and an inverter 500 for inverting a gate signal.

A gate signal is, for example, a pulse signal the potential of which changes from the H level to the L level or from the L level to the H level in a predetermined cycle.

The analog switch section 100 includes the NMOS transistor NM1 and a PMOS transistor PM1, to sources of which an analog input signal is input from a signal line 10 and from drains of which an analog output signal is output to a signal line 20. The sources of the NMOS transistor NM1 and PMOS transistor PM1 are connected and the drains of the NMOS transistor NM1 and PMOS transistor PM1 are connected. As a result, the NMOS transistor NM1 and PMOS transistor PM1 are connected in parallel. Output from the level conversion circuit 400 is input to the gate of the NMOS transistor NM1 via a signal line 30. A gate signal is input to a gate of the PMOS transistor PM1 via a signal line 40.

The comparator circuit 200 inputs an analog input signal and a reference signal via the signal line 10 and a signal line 50, respectively, and compares the input potential Vi of the analog input signal and the reference potential of the reference signal. If the input potential Vi is lower than the reference potential, then the comparator circuit 200 outputs potential at the L level. If the input potential Vi is higher than the reference potential, then the comparator circuit 200 outputs potential at the H level.

The voltage boost circuit 300 is connected to the inverter 500 and includes a capacitive element C1 where an inverted gate signal, being output from the inverter 500, is input. The capacitive element C1 is connected to the cathode of a diode D1. Power supply voltage VDD is input to the anode of the diode D1 and its cathode is connected to a drain of a PMOS transistor PM2. Power supply voltage VDD is input to a source of the PMOS transistor PM2. A signal output from the comparator circuit 200 is input to a gate of the PMOS transistor PM2 via a signal line 60. A signal output from the drain of the PMOS transistor PM2 is input to the level conversion circuit 400 via a signal line 70.

The level conversion circuit 400 inputs a gate signal via the signal line 40, inputs a signal from the voltage boost circuit 300 via the signal line 70, converts the gate signal on the basis of the signal input via the voltage boost circuit 300 so that the H or L level of the gate signal will be determined surely, and outputs the gate signal to the signal line 30. The detailed structure and function of the level conversion circuit 400 will be described later.

It is assumed that reference potential is VDD/4.

Now, operation performed in the analog switch circuit 1 will be described.

In the analog switch circuit 1 according to an embodiment of the present invention, by changing the potential of a gate signal from the H level to the L level, the PMOS transistor PM1 is turned on and the NMOS transistor NM1 is turned on. As a result, there is continuity between the signal lines 10 and 20. That is to say, the switch is in the ON state.

An overview of operation performed in the analog switch circuit 1 in the case of the input potential Vi of an analog input signal being lower than reference potential will be given first.

If input potential Vi is lower than reference potential, the potential of the signal line 60, being output from the comparator circuit 200, changes to the L level, the PMOS transistor PM2 turns on, and the potential of the signal line 70 is power supply voltage VDD. Therefore, the H level of the potential of the signal line 30, being output from the level conversion circuit 400, corresponds to VDD.

Input potential Vi is lower than reference potential (VDD/4). Therefore, even if the H level of the signal line 30 corresponds to VDD, voltage between the gate and source of the NMOS transistor NM1 is higher than 3VDD/4. As a result, the ON-state resistance of the NMOS transistor NM1 is tow and an increase in time taken to charge load capacitance on the output side is slight. Moreover, voltage between the gate and source of the NMOS transistor NM1 is VDD at the most, so MOS transistor structure will not break down.

Next, operation performed in the case of the input potential Vi of an analog input signal being higher than reference potential will be described.

In this case, the potential of the signal line 60, being output from the comparator circuit 200, changes to the H level and the PMOS transistor PM2 turns off. As a result, the potential of the signal line 70 is (VDD−VD1) lower than VDD by VD1, being the forward voltage of the diode D1. If a gate signal is at the H level, output from the inverter 500 is at the L level. Therefore, when a gate signal changes from the H level to the L level, output from the inverter 500 changes from the L level to the H level. Therefore, the potential of the signal line 70 will rise from (VDD−VD1) to VDD. The H level of output from the comparator circuit 200 corresponds to VDD, so the potential of the signal line 70 rises from VDD to about (VDD+VTH) higher than VDD by VTH, being the threshold voltage of the PMOS transistor PM2. This boosted potential (VDD+VTH) is supplied to the level conversion circuit 400, so the H level of the signal line 30 is also (VDD+VTH).

Therefore, when the input potential Vi of an analog input signal is about VDD/2 where the ON-state resistance of the analog switch section 100 will be maximized, voltage between the gate and source of the NMOS transistor NM1 is about VDD/2+VTH. That is to say, voltage between the gate and source of the NMOS transistor NM1 increases by about VTH compared with a case where the potential of the signal line 70 is not boosted. As a result, the ON-state resistance of the analog switch section 100 can be reduced.

Moreover, capacitance from the input side of an analog input signal increases only by the input capacitance of the comparator circuit 200. This will not ruin the effect of an increase in operation speed obtained by boosting the potential of the signal line 30, being the gate of the NMOS transistor NM1.

Furthermore, only if the input potential Vi of an analog input signal is higher than reference potential (VDD/4), the H level of the signal line 30 is (VDD+VTH). Therefore, voltage between the gate and source of the NMOS transistor NM1 is (3VDD/4+VTH) at the most. This voltage should be lower than or equal to the breakdown voltage of a MOS transistor. By adjusting reference potential with the value of VTH and the breakdown voltage of a MOS transistor taken into consideration, voltage between the gate and source of the NMOS transistor NM1 can be made lower than or equal to the breakdown voltage.

In addition, unlike conventional circuits, there is no need to charge the signal line 30, being the gate of the NMOS transistor NM1, to the input potential Vi of an analog input signal before boosting the potential of the signal line 30. This saves waiting time for charging the potential of the gate of the NMOS transistor NM1 to input potential Vi and therefore enables high-speed operation.

As described above, with the analog switch circuit 1 according to the present invention, the problem of there being a need to charge the potential of the gate of an NMOS transistor included in the analog switch section 100 to the input potential Vi of an analog signal before beginning to boost the potential of a conventional circuit and the problem of an increase in the input capacitance of the analog switch section 100 can be solved and the potential of the gate of the NMOS transistor NM1 included in the analog switch section 100 can be boosted. This reduces the ON-state resistance of the NMOS transistor NM1 and high-speed operation will be achieved.

Only if input potential Vi is higher than reference potential, the potential of the gate of the NMOS transistor NM1 included in the analog switch section 100 is boosted. This prevents voltage between the gate and source of the NMOS transistor NM1 from exceeding the breakdown voltage. As a result, high-speed operation at low voltage and the observance of a restriction on breakdown voltage regardless of circuit constants or operating conditions are reconciled.

The above descriptions have been given with the circuit for boosting the potential of the gate of the NMOS transistor NM1 as an example. However, it is a matter of course that a circuit for making the potential of the gate of the PMOS transistor PM1 lower than GND can be used in the same way of thinking. In this case, the voltage boost circuit 300 shown in FIG. 1 makes the potential of the gate of the PMOS transistor PM1 negative power supply potential or ground potential if input potential Vi is higher than reference potential. The voltage boost circuit 300 makes the potential of the gate of the PMOS transistor PM1 lower than negative power supply potential or ground potential if input potential Vi is lower than reference potential.

Now, an embodiment of the present invention will be described in detail.

The level conversion circuit 400 and control over the potential of the signal line 30, being the potential of the gate of the NMOS transistor NM1 included in the analog switch section 100 shown in FIG. 1, will be described in detail.

Figure 2:
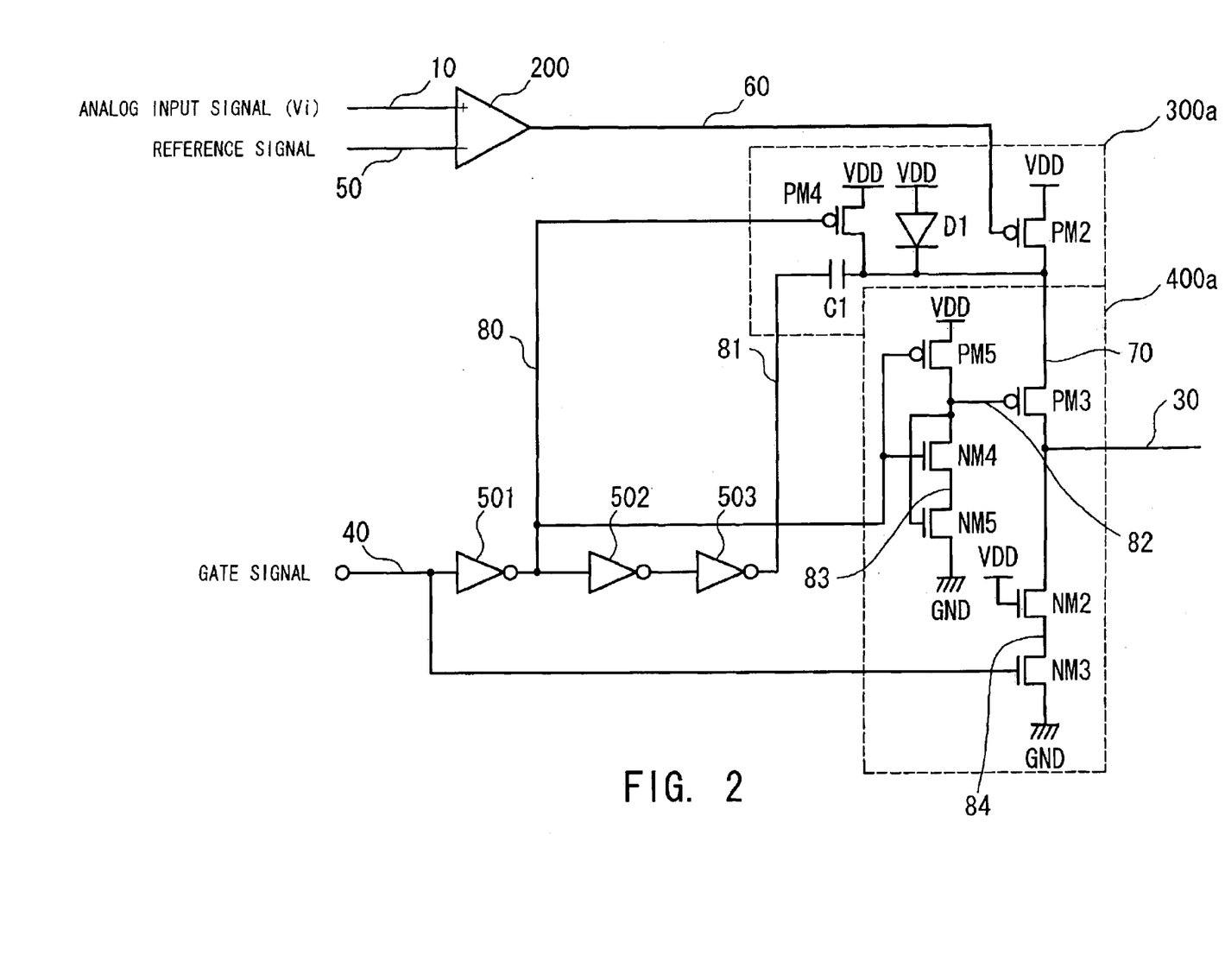
FIG. 2 is a circuit diagram showing in detail the level conversion circuit in the analog switch circuit shown in FIG. 1, excluding the analog switch section.

FIG. 2 is a circuit diagram showing in detail the level conversion circuit in the analog switch circuit shown in FIG. 1, excluding the analog switch section.

The analog switch section 100 is the same as that shown in FIG. 1, so it is omitted.

Components in FIG. 2 corresponding to those shown in FIG. 1 are marked with the same symbols and descriptions of them will be omitted. Inverters 501, 502, and 503 shown in FIG. 2 correspond to the inverter 500 shown in FIG. 1. Unlike the voltage boost circuit 300 shown in FIG. 1, a voltage boost circuit 300a shown in FIG. 2 includes a PMOS transistor PM4. Power supply voltage VDD is input to a source of the PMOS transistor PM4. A drain of the PMOS transistor PM4 is connected to a point between a capacitive element C1 and a cathode of a diode D1. A gate of the PMOS transistor PM4 is connected so that a signal obtained by inverting a gate signal input to a signal line 40 by the inverter 501 will be input there. The level conversion circuit 400 shown in FIG. 1 corresponds to a combination of a level conversion circuit 400a and the inverter 501 shown in FIG. 2. In FIG. 2, a gate signal the potential of which is the same as that of the signal line 40 and a signal obtained by inverting the gate signal by the inverter 501 are input to the level conversion circuit 400a.

The level conversion circuit 400a includes a PMOS transistor PM3 a source of which is connected to a signal line 70 for supplying output from the voltage boost circuit 300a. A drain of the PMOS transistor PM3 is connected to an output signal line 30. The level conversion circuit 400a also includes an NMOS transistor NM2 a drain of which is connected to the drain of the PMOS transistor PM3. Power supply voltage VDD is applied to a gate of the NMOS transistor NM2. The level conversion circuit 400a also includes an NMOS transistor NM3 a drain of which is connected to a source of the NMOS transistor NM2. A gate signal is input to a gate of the NMOS transistor NM3 via the signal line 40. A source of the NMOS transistor NM3 is connected to GND. The level conversion circuit 400a also includes a PMOS transistor PM5. Power supply voltage VDD is applied to a source of the PMOS transistor PM5 and a gate signal inverted by the inverter 501 is input to a gate of the PMOS transistor PM5. A gate of the p MOS transistor PM3 is connected to a drain of the PMOS transistor PM5.

The level conversion circuit 400a also includes an n MOS transistor NM4 a drain of which is connected to a drain of the PMOS transistor PM5. A gate signal inverted by the inverter 501 is input to a gate of the NMOS transistor NM4. The level conversion circuit 400a also includes an NMOS transistor NM5 a drain of which is connected to a source of the NMOS transistor NM4. A gate of the NMOS transistor NM5 is connected to the drain of the PMOS transistor PM5. A source of the NMOS transistor NM5 is connected to GND.

Now, operation performed in the circuit shown in FIG. 2 will be described.

It is assumed that reference potential is VDD/4.

Operation performed in the circuit in FIG. 2 in the case of the input potential Vi of an analog input signal being lower than reference potential will be described first.

Input potential Vi is lower than reference potential. Therefore, output from a comparator circuit 200 is at the L level and a PMOS transistor PM2 is in the ON state. As a result, the potential of the signal line 70 becomes VDD.

When a gate signal is at the H level, a signal line 80 is at the L level. Accordingly, the PMOS transistor PM4 is in the ON state and the potential of the signal line 70 becomes VDD regardless of the input potential Vi. When the signal line 80 changes to the L level, the PMOS transistor PM5 turns on and the NMOS transistor NM4 turns off. Therefore, a signal line 82 changes to the H level. As a result, the PMOS transistor PM3 turns off. Moreover, the NMOS transistor NM3 is in the ON state, so the potential of the signal line 30 becomes a GND level (0 V).

When the potential of the signal line 40 where a gate signal is input changes from the H level to the L level, the signal line 80 changes to the H level and the PMOS transistor PM4 turns off. Moreover, when the signal line 80 changes to the H level, the PMOS transistor PM5 turns off, the NMOS transistor NM4 turns on, and the signal line 82 changes to the L level. As a result, the PMOS transistor PM3 turns on. In addition, the NMOS transistor NM3 turns off. The PMOS transistor PM3 is in the ON state and the potential of the signal line 70 is VDD, so the potential of the signal line 30 becomes VDD.

Now, operation performed in the level conversion circuit 400a in the case of input potential Vi being higher than reference potential will be described.

Input potential Vi is higher than reference potential. Therefore, output from the comparator circuit 200 is at the H level and the PMOS transistor PM2 is in the OFF state.

If a gate signal changes from the H level to the L level, the signal line 80 is at the L level at the initial stage (when the gate signal is at the H level) because there is the inverter 501. The signal line 80 is at the L level, so the PMOS transistor PM4 is in the ON state. The potential of the signal line 70 therefore is VDD.

When the gate signal changes to the L level, the potential of the signal line 80 is inverted by the inverter 501 to the H level and the PMOS transistor PM4 turns off. At the same time the PMOS transistor PM5 also turns off and the NMOS transistor NM4 turns on. As a result, the potential of the signal line 82 drops to about the threshold voltage VTH of the NMOS transistor NM4. When the NMOS transistor NM4 turns on, the potential of the signal line 82 becomes equal to that of a signal line 83. This means that diode connection is made at the NMOS transistor NM5. The potential of the signal lines 82 and 83 therefore is about VTH higher than GND. The potential of the signal line 82 drops, so the PMOS transistor PM3 turns on. The gate signal is at the L level, so the NMOS transistor NM3 is in the OFF state. The PMOS transistor PM3 turns on, so the potential of the signal line 30, being output, rises to about VDD.

It is clear that voltage higher than VDD is applied to no MOS transistor at the initial stage at which the potential of the signal line 70 is VDD.

A signal line 81 changes to the H level delay time, which occurs in the inverters 502 and 503, after the signal line 80 changes from the L level to the H level. The PMOS transistors PM2 and PM4 are in the OFF state. Therefore, when the signal line 81 changes from the L level to the H level, the potential of the signal line 70 rises. Potential output from the comparator circuit 200 and the potential of the signal line 80 are VDD. The PMOS transistor PM3 is in the ON state. Therefore, when the potential of the signal line 70 rises to about (VDD+VTH), the potential of the signal line 30 is also boosted to about (VDD+VTH), which is higher than VDD.

Now, a mechanism for preventing a too high voltage from being applied to each MOS transistor even in the case of the potential of the signal lines 30 and 70 being boosted to about (VDD+VTH) will be described.

When the potential of the signal lines 30 and 70 has been boosted to about (VDD+VTH), the potential of the gates of the PMOS transistors PM2 and PM4 is VDD, the potential of their sources is (VDD+VTH), and the potential of their drains is VDD. Therefore, with the PMOS transistors PM2 and PM4 voltage between the gate and source and between the drain and source are about VTH at the most.

With the PMOS transistor PM3, the potential of the source is (VDD+VTH), the potential of the drain is also (VDD+VTH), and the potential of the gate is equal to that of the signal line 82. The potential of the signal line 82 is about VTH, so voltage between the gate and source of the PMOS transistor PM3 is VDD. Therefore, the potential of the signal lines 30 and 70 can be boosted to (VDD+VTH) without applying a too high voltage to the PMOS transistor PM3.

Now, the function of the NMOS transistor NM2 will be described. The gate signal is at the L level, so the NMOS transistor NM3 is in the OFF state. Therefore, when the potential of the signal lines 30 and 70 is boosted to (VDD+VTH), the potential of the signal line 84 will rise. As a result, a too high voltage may be applied to the NMOS transistor NM3. If the NMOS transistor NM2 is located, the potential of its gate is VDD. As a result, the potential of the signal line 84 rises to (VDD−VTH) and then stabilizes at this value. The potential of the drain of the NMOS transistor NM3 therefore is also (VDD−TTH) and a too high voltage is not applied. The potential of the gate, drain, and source of the NMOS transistor NM2 itself are VDD, (VDD+VTH), and (VDD−TTH) respectively. This means that a too high voltage is not applied to the NMOS transistor NM2.

As described above, the signal line 70 in the level conversion circuit 400a, the potential of which has been boosted is connected to the source of the PMOS transistor PM3, potential corresponding to the L level of the signal line 82 connected to the gate of the PMOS transistor PM3 is set to VTH higher than GND, and the n MOS transistor NM2 is located between the NMOS transistor NM3 for driving a signal output to the signal line 30 and the signal line 30 to prevent a too high voltage from being applied to the drain of the NMOS transistor NM3. As a result, the level conversion circuit 400a for driving the gate of the NMOS transistor NM1 in the analog switch section 100 with a boosted voltage can be protected against overvoltage.

Now, the comparator circuit 200 in particular in the analog switch circuit 1 according to the embodiment of the present invention will be described in detail.

Figure 3:
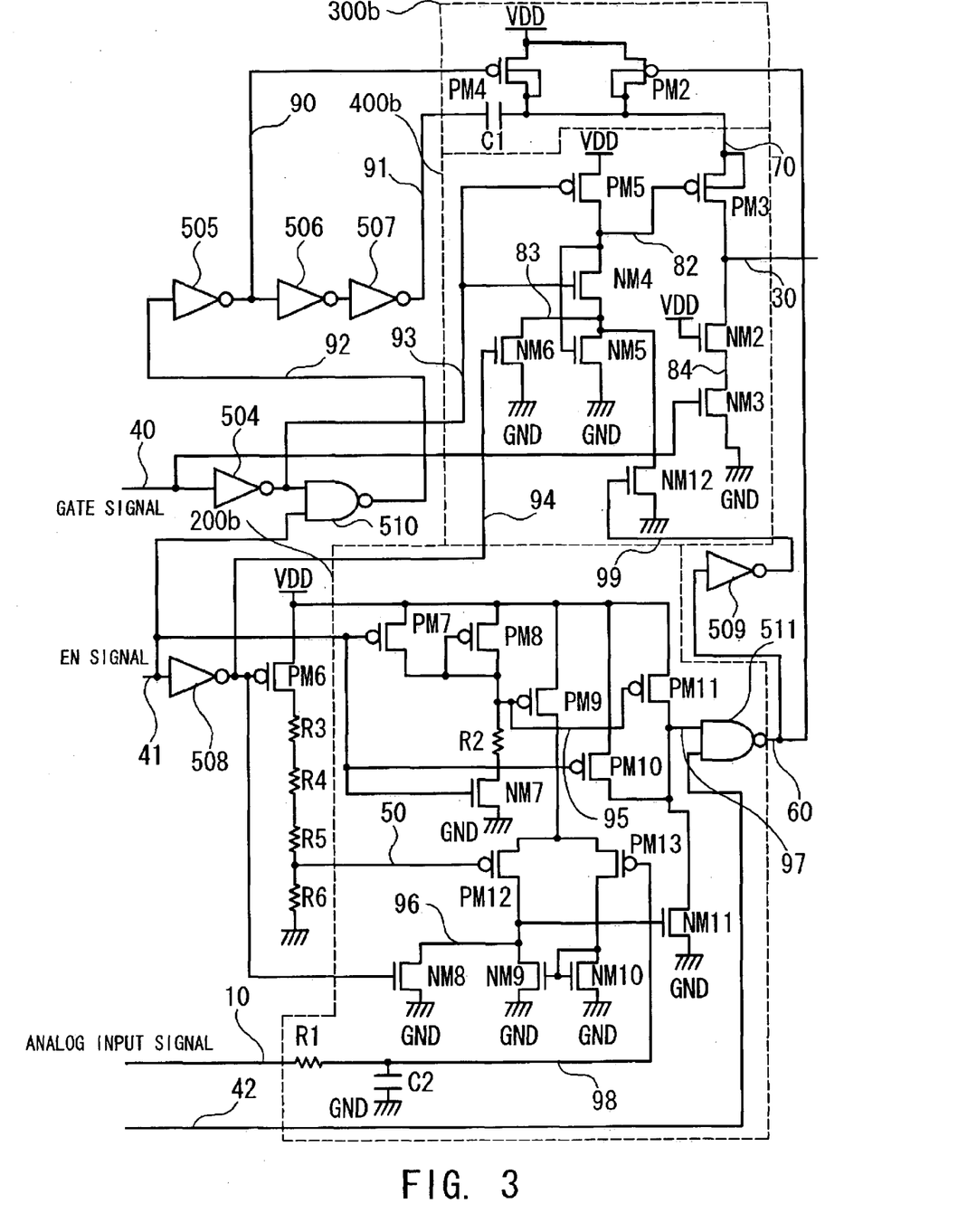
FIG. 3 is a circuit diagram showing the detailed structure of the comparator circuit, voltage boost circuit, and level conversion circuit in the analog switch circuit, excluding the analog switch section.

FIG. 3 is a circuit diagram showing the detailed structure of the comparator circuit, voltage boost circuit, and level conversion circuit in the analog switch circuit, excluding the analog switch section.

A voltage boost circuit 300b and level conversion circuit 400b shown in FIG. 3 differ slightly from the voltage boost circuit 300a and level conversion circuit 400a shown in FIG. 2 in structure. That is to say, the voltage boost circuit 300b and level conversion circuit 400b have some new functions.

Components in FIG. 3 corresponding to those shown in FIG. 1 or 2 are marked with the same symbols and descriptions of them will be omitted.

A gate signal on a signal line 40 is input to the voltage boost circuit 300b. This is the same with the voltage boost circuit 300a shown in FIG. 2. In the case of FIG. 3, however, a gate of a p MOS transistor PM4 is connected to a signal line 90. A signal transmitted to the signal line 90 is as follows.

A gate signal is inverted by an inverter 504 connected to the signal line 40 and output from the inverter 504 is input to a NAND circuit 510. On the other hand, an enable signal (EN signal 41) input from a signal line 41 is also input to the NAND circuit 510. A NAND process is performed on the output from the inverter 504 and the EN signal 41. Output from the NAND circuit 510 is input to an inverter 505 via a signal line 92. The inverter 505 inverts a signal on the signal line 92 and transmits output to the signal line 90.

A signal line 91 is connected to a capacitive element C1 in the voltage boost circuit 300b. A signal transmitted to the signal line 91 is obtained by processing the signal output from the inverter 505 by inverters 506 and 507. The signal is delayed by the inverters 506 and 507. The diode D1 included in the voltage boost circuit 300a in FIG. 2 is not shown in the voltage boost circuit 300b in FIG. 3, but a PMOS transistor PM2 and the PMOS transistor PM4 are connected in the way shown in FIG. 3 to form pn junctions, which will function the same as the diode D1.

The signal obtained by inverting the gate signal on the signal line 40 by the inverter 504 is input to the level conversion circuit 400b via a signal line 93 connected to gates of a PMOS transistor PM5 and NMOS transistor NM4. This is the same with the level conversion circuit 400a in FIG. 2.

The level conversion circuit 400b differs from the level conversion circuit 400a in FIG. 2 in NMOS transistors NM6 and NM12. That is to say, a gate of the NMOS transistor NMB is connected to a signal line 94 for transmitting output from an inverter 508 connected to the signal line 41 for transmitting the EN signal. A drain of the n MOS transistor NM6 is connected to a source of the NMOS transistor NM4 (a drain of an n MOS transistor NM5) and a source of the NMOS transistor NM6 is connected to GND. A gate of the NMOS transistor NM12 is connected to a signal line 99 for transmitting a signal obtained by inverting by an inverter 509 connected to a signal line 60 for transmitting output from a comparator circuit 200b. A drain of the NMOS transistor NM12 is connected to the source of the NMOS transistor NM4 (the drain of the n MOS transistor NM5) and a source of the NMOS transistor NM12 is connected to GND. The functions and operation of the NMOS transistors NM6 and NM12 will be described later.

Resistors R3 through R6 and a PMOS transistor PM6 function as a circuit for dividing power supply voltage VDD and generating reference potential to be output to a signal line 50. A gate of the PMOS transistor PM6 is connected to the output side of the inverter 508 for inputting and inverting the EN signal 41. Power supply voltage VDD is input to a source of the PMOS transistor PM6 and the resistor R3 is connected to a drain of the PMOS transistor PM6. The resistors R3 and R4 are connected in series. The same applies to the resistors R4 and R5 and the resistors R5 and R6.

Now, the structure of the comparator circuit 200b will be described.

PMOS transistors PM7 and PM8, a resistor R2, and an NMOS transistor NM7 included in the comparator circuit 200b function as a circuit for generating a bias on a differential circuit which functions as a comparator on a signal line 95. The EN signal 41 is input to a gate of the PMOS transistor PM7, power supply voltage VDD is input to a source of the PMOS transistor PM7, and a drain of the PMOS transistor PM7 is connected to a gate of the PMOS transistor PM8. The gate of the PMOS transistor PM8 is connected to a drain of the PMOS transistor PM8. Power supply voltage VDD is input to a source of the PMOS transistor PM8 and the drain of the PMOS transistor PM8 is connected to the resistor R2. One end of the resistor R2 is connected to the drain of the PMOS transistor PM8 and the other end of the resistor R2 is connected to a drain of the NMOS transistor NM7. The EN signal 41 is input to a gate of the NMOS transistor NM7, the drain of the NMOS transistor NM7 is connected to the resistor R2, and a source of the NMOS transistor NM7 is connected to GND.

PMOS transistors PM9 through PM13 and NMOS transistors NM8 through NM11 make up a differential circuit and these MOS transistors and a NAND circuit 511 function as a comparator. A resistor R1 and a capacitive element C2 have the function of filtering an analog signal.

A gate of the PMOS transistor PM9 is connected to the drain of the PMOS transistor PM8, being output from the bias circuit. Power supply voltage VDD is input to a source of the PMOS transistor PM9 and a drain of the p MOS transistor PM9 is connected to sources of the PMOS transistors PM12 and PM13. The EN signal 41 is input to a gate of the PMOS transistor PM10, power supply voltage VDD is input to a source of the PMOS transistor PM10, and a drain of the PMOS transistor PM10 is connected to a drain of the NMOS transistor NM11. A gate of the PMOS transistor PM11 is connected to the signal line 95 to input output from the bias circuit. Power supply voltage VDD is input to a source of the PMOS transistor PM11 and a drain of the PMOS transistor PM11 is connected to the drain of the NMOS transistor NM11. If reference potential is set to, for example, VDD/4, divided reference potential is taken via the signal line 50 from a point in FIG. 3 where the resistor R5 and R6 connect, and is input to a gate of the p MOS transistor PM12. A source of the PMOS transistor PM12 is connected to the drain of the PMOS transistor PM9 and a drain of the PMOS transistor PM12 is connected to a drain of the NMOS transistor NM9. An analog input signal (Vi) is input to a gate of the PMOS transistor PM13 from a signal line 10. A source of the PMOS transistor PM13 is connected to the drain of the PMOS transistor PM9 and a drain of the PMOS transistor PM13 is connected to a drain of the NMOS transistor NM10. A gate of the NMOS transistor NM8 is connected to the output side of the inverter 508 for inverting the EN signal 41, a drain of the NMOS transistor NM8 is connected to the drain of the PMOS transistor PM12, and a source of the NMOS transistor NM8 is connected to GND. A gate of the NMOS transistor NM9 is connected to the drain of the PMOS transistor PM13, the drain of the NMOS transistor NM9 is connected to the drain of the PMOS transistor PM12, and a source of the NMOS transistor NM9 is connected to GND. A gate and the drain of the NMOS transistor NM10 are connected to the drain of the PMOS transistor PM13 and a source of the NMOS transistor NM10 is connected to GND. A gate of the NMOS transistor NM11 is connected to the drain of the PMOS transistor PM12, the drain of the NMOS transistor NM11 is connected to the drains of the PMOS transistors PM10 and PM11, and a source of the MOS transistor NM11 is connected to GND. The NAND circuit 511 inputs a signal from the drain of the PMOS transistor PM11 and a signal input from a signal line 42, performs a NAND process on these signals, and outputs a signal to the signal line 60 as comparator output.

Signals input to the signal lines 41 and 42 control voltage boost operation. When the potential of the EN signal 41 is at the H level and the potential of a signal input to the signal line 42 is at the H level, the input potential Vi of an analog input signal and the reference potential of the signal line 50 are compared to determine whether to boost the potential of the signal line 70. When the potential of the EN signal 41 is at the L level, the potential of the signal line 70 is VDD regardless of input potential Vi. When the potential of the signal line 41 is at the H level and the potential of a signal input to the signal line 42 is at the L level, the circuit enters mode in which the potential of the signal line 70 is boosted, regardless of input potential Vi.

Now, operation in the circuit shown in FIG. 3 will be described.

Operation performed when the potential of the EN signal 41 and the potential of the signal line 42 are at the H level will be described first.

The potential of the EN signal 41 is at the H level, so the PMOS transistor PM7 is in the OFF state and the NMOS transistor NM7 is in the ON state. An electric current flows through the resistor R2 and potential corresponding to this electric current is generated on the signal line 95 as bias potential. The phase of a signal on the signal line 94 is reverse to that of the EN signal 41, so the potential of the signal line 94 is at the L level. Therefore, the PMOS transistor PM6 is in the ON state, an electric current flows from the resistor R3 to the resistor R6, and the potential of VDD/4 is generated on the signal line 50 as reference potential (if the resistance values of the resistors R3 through R6 are equal). Moreover, the potential of a signal on the signal line 42 is at the H level, so the potential of comparator output generated on the signal line 60 is obtained by inverting a signal on a signal line 97.

The PMOS transistors PM9 through PM13 and NMOS transistors NM8 through NM11 included in the differential circuit compare input potential Vi and the reference potential. If the input potential Vi is higher than the reference potential, then the potential of the signal line 97 changes to the L level. If the input potential Vi is lower than the reference potential, then the potential of the signal line 97 changes to the H level. Therefore, if the input potential Vi is higher than the reference potential, then the potential of the signal line 60 changes to the H level. If the input potential Vi is lower than the reference potential, then the potential of the signal line 60 changes to the L level.

If the input potential Vi is lower than the reference potential, the potential of the signal line 60 changes to the L level. As a result, the PMOS transistor PM2 is always in the ON state and the potential of the signal line 70 is VDD. As described in FIG. 2, the potential of the signal line 70 is not boosted.

With the circuit shown in FIG. 3, the potential of the signal line 70 is not boosted when the potential of the signal line 60 on which comparator output is generated is at the L level. In this case, the potential of a signal line 83 is set to GND by the NMOS transistor NM12. As a result, voltage between the gate and source of the PMOS transistor PM3 can be set to VDD and the circuit can operate at a lower voltage.

If the potential of the analog signal is higher than the reference potential, the potential of the signal line 60 changes to the H level. As a result, the PMOS transistor PM2 turns off. In this case, the potential of the signal line 70 is boosted when a gate signal changes from the H level to the L level.

When the gate signal is at the H level, the potential of the signal line 90 is at the L level and the potential of the signal line 70 is set to VDD by the PMOS transistor PM4. When the gate signal changes to the L level, the potential of the signal line 90 changes to the H level because the EN signal 41 is at the H level. As a result, the PMOS transistor PM4 turns off and the potential of the signal line 91 also changes from the L level to the H level. This change in the potential of the signal line 91 will be delayed by the inverters 506 and 507. As a result of the potential of the signal line 91 changing from the L level to the H level, the potential of the signal line 70 is boosted to (VDD+VTH).

At this time, the NMOS transistor NM12 turns off, so the L level of the signal line 82 corresponds to about VTH. Therefore, the circuit in FIG. 3 operates the same as the circuit in FIG. 2.

Now, the operation of a filter made up of the resistor R1 and capacitive element C2 will be described.

This filter prevents an abrupt change in analog input signal input from being transmitted to a signal line 98, being input to the differential circuit.

In FIG. 1, it is assumed that input potential Vi is VDD/2 and that output from the analog switch section 100 is charged from 0 V.

By changing a gate signal from the H level to the L level, the PMOS transistor PM1 included in the analog switch section 100 turns on and the potential of the signal line 30 becomes about VDD. Therefore, the NMOS transistor NM1 also turns on. At this time, the signal line 20 on the output side begins to be charged and the potential of the signal line 20 begins to rise. Naturally, a circuit for driving the signal line 10 where an analog input signal is input has a finite impedance, so the potential of the signal line 10 drops transiently. As shown in the circuit in FIG. 3, by forming a filter with the resistor R1 and capacitive element C2, the potential of the signal line 98, being input to the differential circuit, will not drop significantly even if the potential of the signal line 10 drops transiently. The potential of the signal line 70 can be boosted unless the potential of the signal line 98 drop below reference potential.

On the other hand, with the conventional analog switch circuit 2 shown in FIG. 4, a drop in the potential of the signal line 10 caused by a finite impedance of a circuit for driving the signal line 10 at the initial stage of charging the signal line 20 on the output side has directly led to a drop in the potential of the gate of the NMOS transistor NM1.

That is to say, in the embodiment of the present invention, reference potential is set to moderately low potential (VDD/4, for example) and the resistor R1 and capacitive element C2 prevent an abrupt drop in input potential Vi from being transmitted to the signal line 98. Therefore, the potential of the signal lines 70 and 30 can be boosted without being influenced by a transient drop in input potential Vi.

Now, operation performed when the EN signal 41 is at the L level will be described.

When the EN signal 41 is at the L level, the PMOS transistors PM7 and PM10 and the NMOS transistor NM8 are in the ON state and the PMOS transistor PM6 and the NMOS transistor NM7 are in the OFF state. The PMOS transistor PM6 is in the OFF state, so an electric current does not flow through the resistors R3 through R6. An electric current does not flow through the resistor R2 either and the potential of the signal line 95 is VDD. An electric current therefore does not flow through the PMOS transistors PM9 through PM13 and NMOS transistors NM8 through NM11 included in the differential circuit. The NMOS transistor NM8 is in the ON state and a signal line 96 is at the L level. As a result, the NMOS transistor NM11 is in the OFF state and the PMOS transistor PM10 makes the potential of the signal line 97 the H level.

This shows that when the EN signal 41 is at the L level and voltage is not boosted, a useless electric current does not flow through the comparator circuit 200b and a reference generation circuit.

The EN signal 41 is at the L level. Therefore, the signal line 92, being output from the NAND circuit 510, is at the H level and the signal lines 90 and 91 are at the L level. The signal lines 90 and 91 will not change from the L level even if a gate signal changes. The signal line 90 is at the L level. As a result, the PMOS transistor PM4 is always in the ON state and the potential of the signal line 70 is always VDD. That is to say, the potential of the signal line 70 is not boosted even if a gate signal changes.

Now, the function and operation of the NMOS transistor NM6 in which the level conversion circuit 400b shown in FIG. 3 differs from the level conversion circuit 400a shown in FIG. 2 will be described.

The EN signal 41 is at the L level and the signal line 94 is at the H level. Therefore, the NMOS transistor NM6 is in the ON state and the potential of the signal line 83 is 0 V. If the potential of the signal line 70 is not boosted, there is no need to keep the potential of the signal line 83 at about VTH. As a result, the potential of the signal line 83 can be set to 0 V and voltage between the gate and source of the PMOS transistor PM3 can be set to VDD. The circuit therefore can operate at a lower voltage. Furthermore, the potential of the signal lines 90 and 91 does not change and a useless electric current for charging or discharging capacitance does not flow.

As stated above, the EN signal 41 is added and mode in which voltage is not boosted is provided. As a result, useless voltage boost operation can be stopped if it is known in advance that the circuit is not used at low power supply voltage.

Now, operation performed when the EN signal 41 and a signal on the signal line 42 are at the H and L levels respectively will be described.

When the EN signal 41 and a signal on the signal line 42 are at the H and L levels respectively, the circuit enters mode in which the potential of the signal line 70 is boosted regardless of input potential Vi.

When a signal on the signal line 42 is at the L level, the potential of the signal line 60, being output from the comparator circuit 200b, is always at the H level regardless of the potential of the signal line 97, being output from the differential circuit. Moreover, the EN signal 41 is at the H level, so the level of a signal on the signal line 92 is reverse to that of a signal on the signal line 93. The potential of the signal lines 30 and 70 is boosted. This is the same with a case where the EN signal 41 and a signal on the signal line 42 are at the H level and where input potential Vi is higher than reference potential. However, when the EN signal 41 and a signal on the signal line 42 are at the H and L levels respectively, the potential of the signal lines 30 and 70 is boosted regardless of the potential of an analog signal input because the potential of the signal line 60, being output from the comparator circuit 200b, is always at the H level.

As stated above, the signal line 42 is added and mode in which voltage is always boosted is provided. As a result, the potential of the signal line 30 can be boosted and ON-state resistance can be reduced if it is known in advance that the circuit is not used at high power supply voltage but always used at low power supply voltage. This applies to a case where input potential Vi is low.

The above descriptions have been given with the circuit for boosting the potential of the gate of the NMOS transistor NM1 as an example. However, it is a matter of course that a circuit for decreasing the potential of the gate of the PMOS transistor PM1 below GND can be provided in the same way of thinking. In this case, it is a matter of course that a filter can be located in a comparator section, that a signal line where a signal for invariably making the potential of the gate of the PMOS transistor PM1 lower than the potential of negative power supply voltage is input can be located, or that a signal line where a signal for not making the potential of the gate of the PMOS transistor PM1 lower than the potential of negative power supply voltage is input can be located. This is the same with the case of FIG. 3.

As has been described in the foregoing, in the present invention, the potential of input to the analog switch and reference potential are compared by the comparator circuit. If the input potential is lower than the reference potential, then the potential of the gate of the NMOS transistor included in the analog switch is set to the potential of power supply voltage and is not boosted. This prevents overvoltage from being applied to the NMOS transistor. Moreover, if the input potential is higher than the reference potential, then the potential of the gate of the NMOS transistor is boosted. This reduces the ON-state resistance of the NMOS transistor and enables high-speed operation.

Furthermore, an increase in the input capacitance of the analog switch can be restrained to roughly the input capacitance of the comparator circuit and will not exercise a bad influence on high-speed operation. In addition, there is no need to charge the gate of the NMOS transistor to input potential before a voltage boost. This also enables high-speed operation.

The foregoing is considered as illustrative only of the principles of the present invention. Further, since numerous modifications and changes will-readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An analog switch circuit for sampling an analog input signal, the circuit comprising:
   an analog switch section including a first n-channel MOS field effect transistor and a first p-channel MOS field effect transistor, sources of which are connected, drains of which are connected, and therefore said first n-channel and first p-channel MOS field transistors are connected in parallel, for receiving the analog input signal and for outputting a sampled analog output signal;
   a comparator circuit for receiving the analog input signal and a reference signal and for comparing the input potential of the analog input signal and the reference potential of the reference signal; and
   a voltage boost circuit for setting a potential of a gate of the first n-channel MOS field effect transistor to a potential of positive power supply voltage in the case of the input potential of the analog input signal being lower than the reference potential at the time of the analog switch section being in a continuity state and for boosting the potential of the gate to a potential higher than the potential of the positive power supply voltage in the case of the input potential of the analog input signal being higher than the reference potential at the time of the analog switch section being in the continuity state.

2. The analog switch circuit according to claim 1, wherein the comparator circuit includes a filter for absorbing a drop in the input potential of the analog input signal input at the time of the analog switch section being in the continuity state.

3. The analog switch circuit according to claim 1, further comprising a signal line for receiving a signal for performing boosting of the potential of the gate of the first n-channel MOS field effect transistor to the potential higher than the potential of the positive power supply voltage regardless of the result of a comparison made by the comparator circuit.

4. The analog switch circuit according to claim 1, further comprising a signal line for receiving a signal for not performing boosting of the potential of the gate of the first n-channel MOS field effect transistor to the potential higher than the potential of the positive power supply voltage regardless of the result of a comparison made by the comparator circuit.

5. An analog switch circuit for sampling an analog input signal, the circuit comprising:
   an analog switch section including a first n-channel MOS field effect transistor and a first p-channel MOS field effect transistor, sources of which are connected, drains of which are connected, and therefore said first n-channel and first p-channel MOS field effect transistors are connected in parallel, for receiving the analog input signal and for outputting a sampled analog output signal;
   a comparator circuit for receiving the analog input signal and a reference signal and for comparing the input potential of the analog input signal and the reference potential of the reference signal; and
   a circuit for setting a potential of a gate of the first p-channel MOS field effect transistor to a potential of negative power supply voltage or ground potential in the case of the input potential of the analog input signal being higher than the reference potential at the time of the analog switch section being in a continuity state and for setting the potential of the gate to a potential lower than the potential of the negative power supply voltage or the ground potential in the case of the input potential of the analog input signal being lower than the reference potential at the time of the analog switch section being in the continuity state.

6. The analog switch circuit according to claim 5, wherein the comparator circuit includes a filter for absorbing a rise in the input potential of the analog input signal input at the time of the analog switch section being in the continuity state.

7. The analog switch circuit according to claim 5, further comprising a signal line for receiving a signal for setting the potential of the gate to the potential lower than the potential of the negative power supply voltage or the ground potential regardless of the result of a comparison made by the comparator circuit.

8. The analog switch circuit according to claim 5, further comprising a signal line for receiving a signal for not setting the potential of the gate to the potential lower than the potential of the negative power supply voltage or the ground potential regardless of the result of a comparison made by the comparator circuit.

* * * * *